United States Patent
Chang

(10) Patent No.: US 9,748,200 B1
(45) Date of Patent: Aug. 29, 2017

(54) MANUFACTURING METHOD OF WAFER LEVEL PACKAGE STRUCTURE

(71) Applicant: Powertech Technology Inc., Hsinchu County (TW)

(72) Inventor: Chia-Hang Chang, Hsinchu County (TW)

(73) Assignee: Powertech Technology Inc., Hsinchu County (TW)

( * ) Notice: Subject to any disclaimer, the term of this patent is extended or adjusted under 35 U.S.C. 154(b) by 0 days.

(21) Appl. No.: 15/347,805

(22) Filed: Nov. 10, 2016

(30) Foreign Application Priority Data

Feb. 5, 2016 (TW) .............................. 105104081 A

(51) Int. Cl.
*H01L 21/00* (2006.01)
*H01L 23/00* (2006.01)
*H01L 21/56* (2006.01)

(52) U.S. Cl.
CPC ............ *H01L 24/96* (2013.01); *H01L 21/565* (2013.01); *H01L 21/568* (2013.01); *H01L 24/02* (2013.01); *H01L 24/13* (2013.01); *H01L 2224/02379* (2013.01); *H01L 2224/13024* (2013.01)

(58) Field of Classification Search
None
See application file for complete search history.

(56) References Cited

U.S. PATENT DOCUMENTS

| 2011/0187002 A1* | 8/2011 | Kishii .................... H01L 24/18 257/773 |
| 2012/0028411 A1* | 2/2012 | Yu ........................ H01L 21/561 438/107 |
| 2012/0028412 A1 | 2/2012 | Jeong et al. |
| 2013/0168848 A1* | 7/2013 | Lin ......................... H01L 24/19 257/737 |
| 2013/0175694 A1* | 7/2013 | Shih .................... H01L 23/3185 257/773 |
| 2014/0252647 A1* | 9/2014 | Huang .............. H01L 23/49827 257/774 |

(Continued)

FOREIGN PATENT DOCUMENTS

| TW | 200910536 | 3/2009 |
| TW | 201119002 | 6/2011 |

(Continued)

OTHER PUBLICATIONS

"Office Action of Taiwan Counterpart Application," dated Nov. 8, 2016, p. 1-p. 5.

*Primary Examiner* — Angel Roman
(74) *Attorney, Agent, or Firm* — Jianq Chyun IP Office

(57) ABSTRACT

A manufacturing method of a wafer level package structure includes the following steps. A chip is disposed on a supporting board, wherein the chip includes an active surface and a back surface opposite to the active surface, and a plurality of pads on the active surface, and the back surface of the chip is adhered to the supporting board through a die attach film (DAF). A molding is disposed on the supporting board to perform a wafer level exposed die molding procedure on the chip, wherein the molding surrounds the chip, and the pads of the chip are exposed out of the molding. A redistribution layer (RDL) is formed on the active surface of the chip, wherein the RDL is electrically connected to the pads. The supporting board and the DAF are removed from the chip.

6 Claims, 7 Drawing Sheets

(56) References Cited

U.S. PATENT DOCUMENTS

| | | | | |
|---|---|---|---|---|
| 2015/0115470 A1* | 4/2015 | Su | ................... | H01L 23/49816 |
| | | | | 257/774 |
| 2016/0013150 A1* | 1/2016 | Tsai | ................. | H01L 21/78 |
| | | | | 438/113 |
| 2016/0190088 A1* | 6/2016 | Yu | ..................... | B32B 37/02 |
| | | | | 438/107 |
| 2016/0343635 A1* | 11/2016 | Rae | ................ | H01L 21/31116 |

FOREIGN PATENT DOCUMENTS

| | | |
|---|---|---|
| TW | 201426965 | 7/2014 |
| TW | 201517183 | 5/2015 |
| TW | 201543586 | 11/2015 |

\* cited by examiner

MANUFACTURING METHOD OF WAFER LEVEL PACKAGE STRUCTURE

CROSS-REFERENCE TO RELATED APPLICATION

This application claims the priority benefit of Taiwan application serial no. 105104081, filed on Feb. 5, 2016. The entirety of the above-mentioned patent application is hereby incorporated by reference herein and made a part of this specification.

BACKGROUND OF THE INVENTION

Field of the Invention

The invention relates to a manufacturing method of a package structure, and particularly relates to a manufacturing method of a wafer level package structure.

Description of Related Art

In a manufacturing process of a wafer level package (e.g., fan out wafer level package (FO-WLP)), in order to support the wafer after thinning, the wafer is usually placed on a wafer support system (WSS). In this way, the wafer is able to withstand various transport in the manufacturing process and avoid wafer warpage which may cause fragmentation.

FIG. 1A to FIG. 1G are schematic diagrams of a manufacturing process of a conventional wafer level package structure. Referring to FIG. 1A, a conventional wafer support system 11 includes a glass supporting board 12 and a gel layer 13 coated on the glass supporting board 12. Next, as shown in FIG. 1B, a chip 20 having a plurality of conductive pillars 24 is disposed on the wafer support system 11. The chip 20 includes an active surface 21 and a back surface 22 opposite to each other, and a plurality of pads 23 on the active surface 21. The back surface 22 of the chip 20 is fixed to the glass supporting board 12 through the gel layer 13.

Then, as shown in FIG. 1C, a molding 30 is disposed on the wafer support system 11 so as to mold the whole chip 20 and the conductive pillars 24 on the chip 20. After that, as shown in FIG. 1D, the molding 30 is ground to expose the conductive pillars 24.

Then, as shown in FIG. 1E, a redistribution layer (RDL) 40 is manufactured on the chip 20. The RDL 40 is connected to the conductive pillars 24. After that, a dielectric layer 45 having openings 46 is formed on the RDL 40. Furthermore, as shown in FIG. 1F, a plurality of solder balls 50 are disposed to the openings 46 so as to be connected to the RDL 40. Lastly, as shown in FIG. 1G, the wafer support system 11 is removed to obtain the conventional wafer level package structure 10.

In the conventional manufacturing process, since a thickness variation of the glass supporting board 12 in different positions of the wafer support system 11 is larger, and the control of flatness and uniformity when coating the gel layer 13 has the manufacturing process limitations, the conductive pillars 24 or the RDL 40 are manufactured on the pads 23 in the conventional manufacturing process to overcome the height difference between different pads 23 after attaching the chip 20 to the wafer support system 11. However, if the flatness of the wafer support system 11 is worse, the required height of the conductive pillars 24 or the RDL 40 is higher, thereby increasing the package cost. Additionally, multiple chemical cleanings are required in the final step of removing the wafer support system 11, and a special test of the cleaning result is also required after chemical cleaning to avoid the gel layer 13 remaining on the glass supporting board 12 or the back surface 22 of the chip 20, so as to affect the subsequent manufacturing process. Thus, the process of removing the wafer support system 11 also requires a certain cost.

SUMMARY OF THE INVENTION

The invention provides a manufacturing method of a wafer level package structure, which has a lower manufacturing cost and less process.

The manufacturing method of the wafer level package structure of the invention includes the following steps. A chip is disposed on a supporting board, wherein the chip includes an active surface and a back surface opposite to the active surface, and a plurality of pads on the active surface. The back surface of the chip is adhered to the supporting board through a die attach film (DAF). A molding is disposed on the supporting board to perform a wafer level exposed die molding procedure on the chip, wherein the molding surrounds the chip, and the pads of the chip are exposed out of the molding. A redistribution layer (RDL) is formed on the active surface of the chip, wherein the RDL is electrically connected to the pads. The supporting board and the DAF are removed from the chip.

According to an embodiment of the invention, before disposing the chip onto the supporting board, the manufacturing method further includes disposing the DAF to the back surface of the chip.

According to an embodiment of the invention, before disposing the chip onto the supporting board, the manufacturing method further includes disposing the DAF onto the supporting board.

According to an embodiment of the invention, after forming the RDL, the manufacturing method further includes disposing a plurality of solder balls onto the RDL.

According to an embodiment of the invention, the supporting board is a dummy silicon wafer.

According to an embodiment of the invention, after performing the wafer level exposed die molding procedure, a surface of the molding away from the supporting board is substantially flush with the active surface of the chip.

According to an embodiment of the invention, in the step of removing the supporting board and the DAF from the chip, the manufacturing method further includes removing the supporting board and the DAF from the chip by cutting or grinding.

According to an embodiment of the invention, a thickness variation of the DAF in different positions is less than 1 micrometer.

A manufacturing method of a wafer level package structure includes the following steps. A plurality of chips are disposed on a supporting board, the plurality of chips having corresponding active surfaces substantially leveled to each other. A molding is disposed on the supporting board to surround lateral sides of the plurality of chips, the active surfaces of the plurality of chips being substantially flush with a surface of the molding. A redistribution layer (RDL) is formed on the active surfaces of the plurality of chips and the surface of the molding. The plurality of chips are removed from the supporting board.

According to an embodiment of the invention, wherein disposing the plurality of chips on the supporting board is adhering the plurality of chips on the supporting board using die attach films, each of the die attach films having different thickness to compensate for difference in thickness of different parts of the supporting board.

According to an embodiment of the invention, a thickness variation of the die attach films from each other is less than 1 micrometer.

According to an embodiment of the invention, further includes a plurality of solder balls are disposed on the redistribution layer to electrically connect the plurality of chips to the solder balls.

According to an embodiment of the invention, wherein disposing a molding on the supporting board to surround lateral sides of the plurality of chips is performing a wafer level exposed die molding procedure on the plurality of chips.

According to an embodiment of the invention, wherein removing the plurality of chips from the supporting board is performing cutting or grinding to remove the plurality of chips from the supporting and reduce thickness of the plurality of chips to a preferred thickness.

According to an embodiment of the invention, the supporting board is a dummy silicon wafer Based on the above, in the manufacturing method of the wafer level package structure of the invention, by using the supporting board composed of the dummy silicon wafer, and fixing the chip to the supporting board through the DAF, the thickness variation of the supporting board composed of the dummy silicon wafer and the DAF in different positions is small. Thereby, the flat platform is provided for supporting the chip. Also, after the chip is disposed on the supporting board, the height variation of the pads is small. Thus, when manufacturing the molding, the wafer level exposed die molding procedure can be used, so that the pads are exposed out of the molding. That is, it is not required to additionally dispose the conductive pillars on the chip. Also, it is not required to grind the molding after manufacturing the molding so as to save multiple processes. Additionally, in the step of removing the supporting board and the DAF from the chip of the manufacturing method of the wafer level package structure of the invention, removing the supporting board and the DAF only by using the method of grinding is more simple and with lower cost in comparison with using the method of chemical cleaning. Also, it can make sure the cleanliness of the supporting board and the cleanliness of the back surface of the chip.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
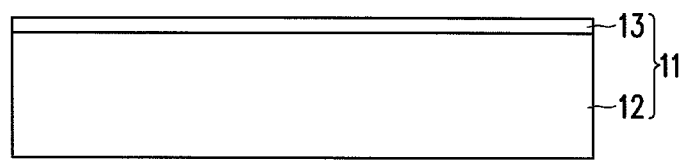
FIG. 1A to FIG. 1G are schematic diagrams of a manufacturing process of a conventional wafer level package structure.
Figure 1B:
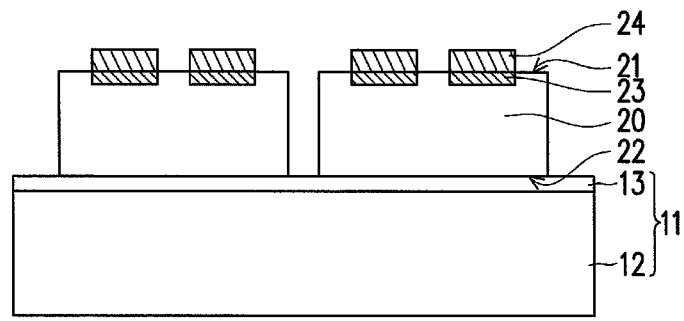
Figure 1C:
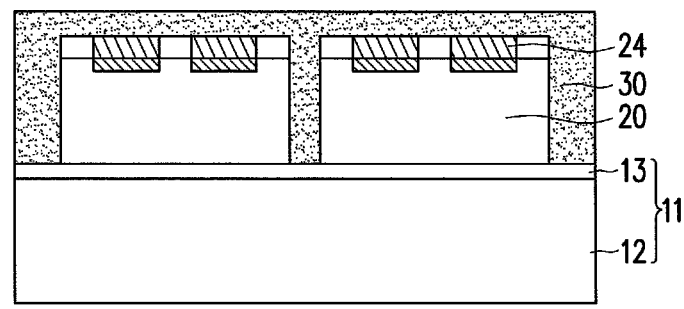
Figure 1D:
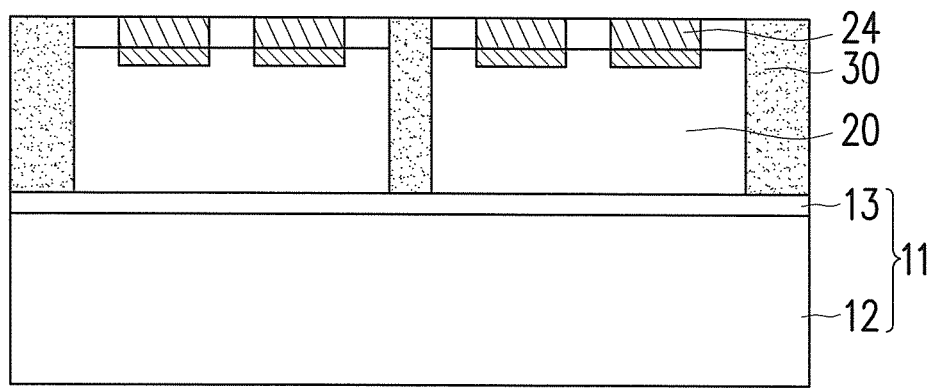
Figure 1E:
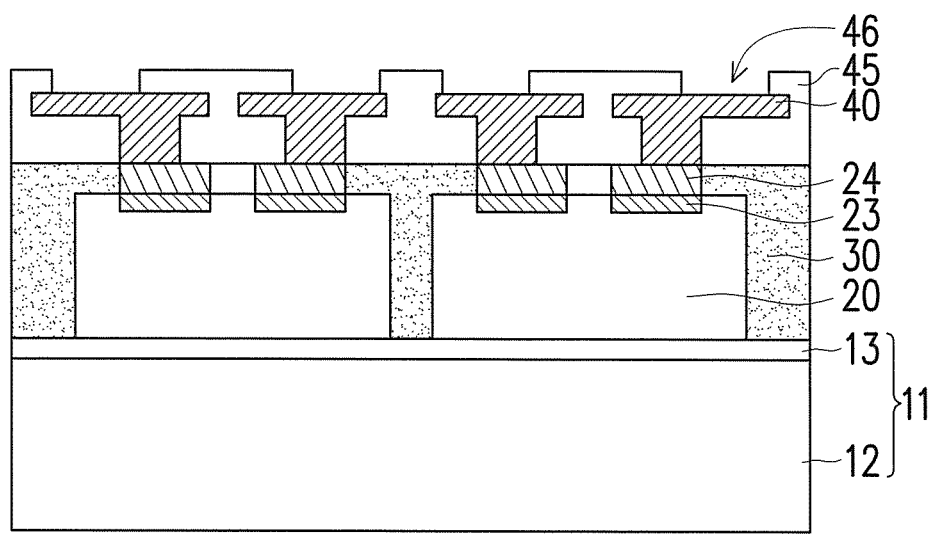
Figure 1F:
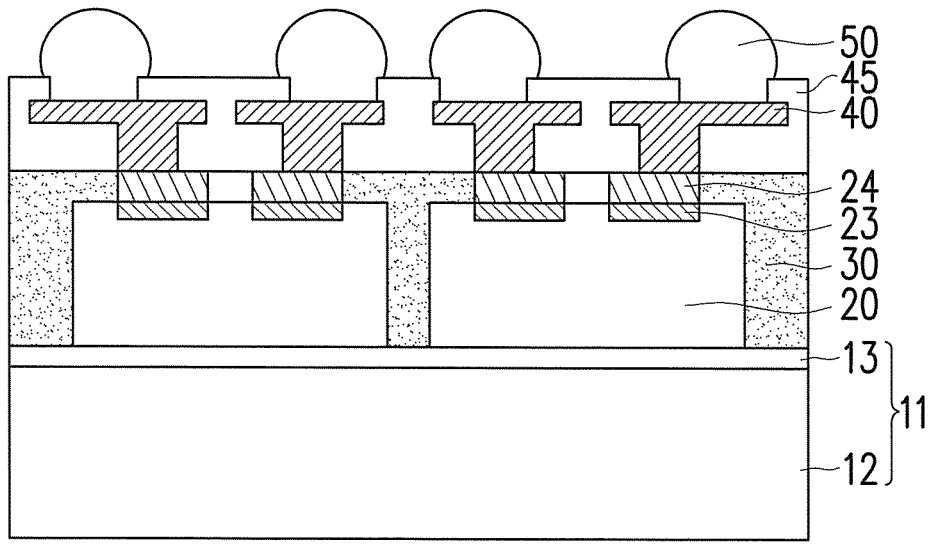
Figure 1G:
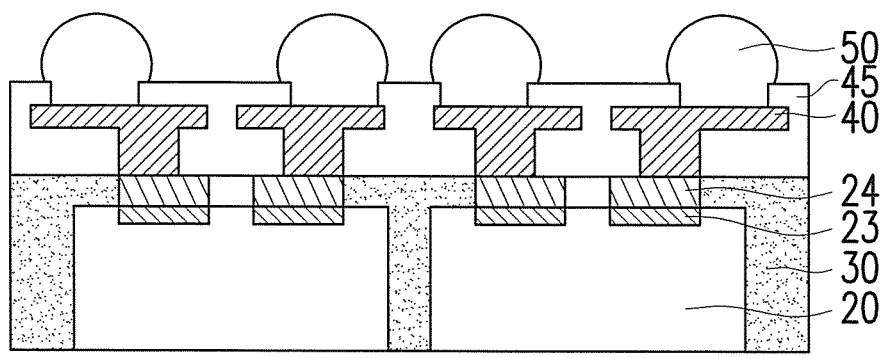

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 2A:
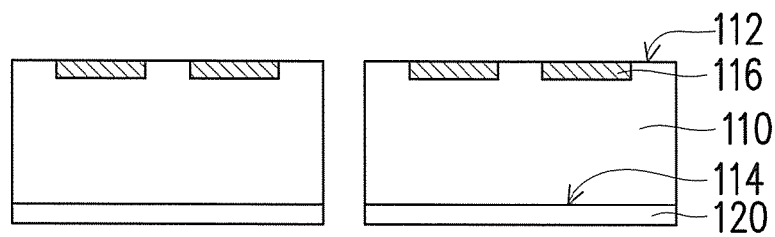
FIG. 2A to FIG. 2F are schematic diagrams of a manufacturing process of a wafer level package structure according to an embodiment of the invention.

FIG. 2A to FIG. 2F are schematic diagrams of a manufacturing process of a wafer level package structure according to an embodiment of the invention. FIG. 3 is a flow diagram of a manufacturing process of a wafer level package structure according to an embodiment of the invention. Referring to FIG. 2A and FIG. 3, a manufacturing process of a wafer level package structure 200 of the embodiment includes the following steps. First, a chip 110 is provided. The chip 110 includes an active surface 112, a back surface 114 opposite to the active surface 112, and a plurality of pads 116 disposed on the active surface 112 (Step 210). As shown in FIG. 2A, the plurality of chips 110 are provided, and the plurality of chips 110 have corresponding active surfaces 112 substantially leveled to each other. Next, a die attach film (DAF) 120 is disposed to the back surface 114 of the chip 110 (Step 220).

Figure 2B:
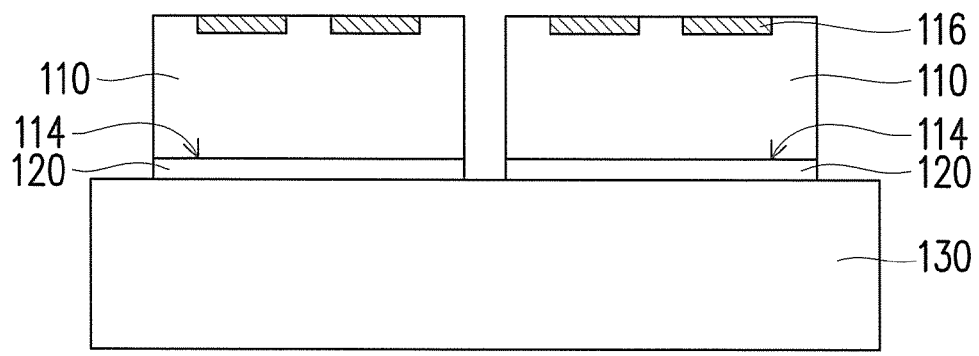
Figure 3:
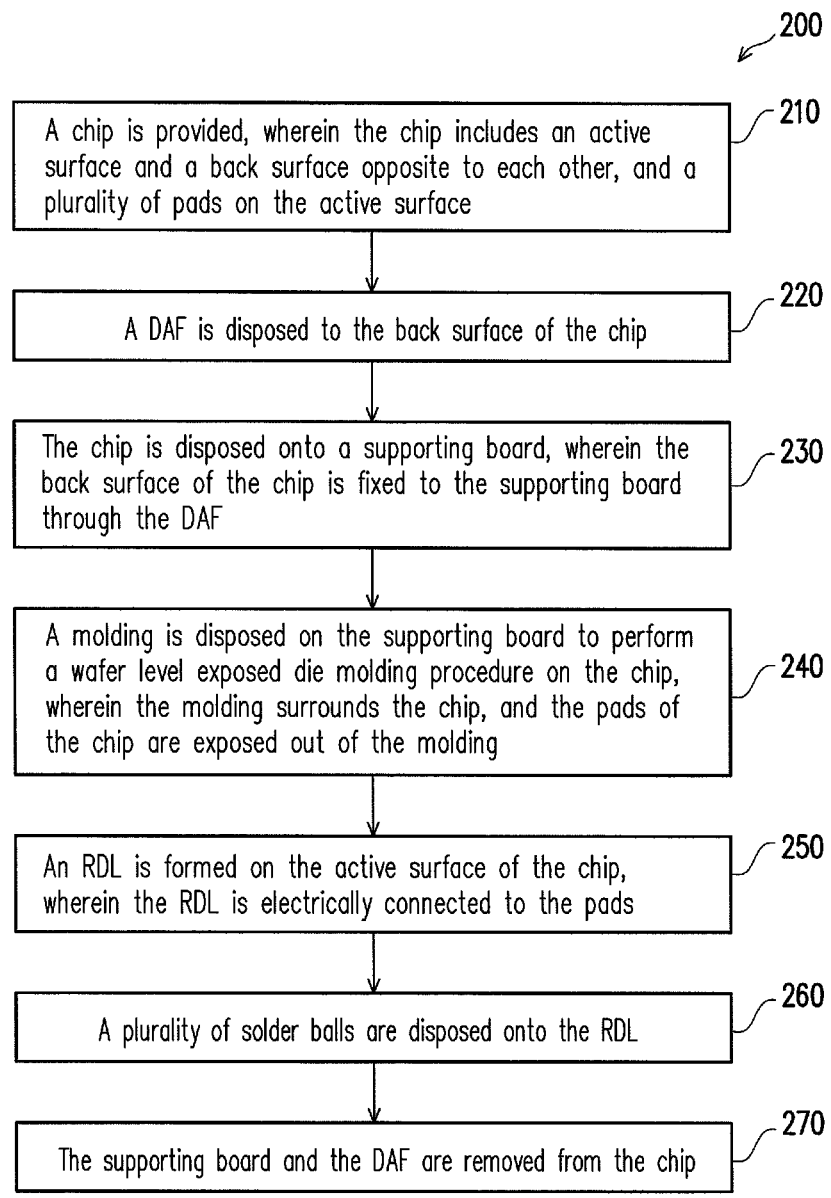
FIG. 3 is a flow diagram of a manufacturing process of a wafer level package structure according to an embodiment of the invention.

Then, as shown in FIG. 2B, the chip 110 is disposed onto a supporting board 130, wherein the back surface 114 of the chip 110 is fixed to the supporting board 130 through the die attach film 120 (Step 230). In the present embodiment, the supporting board 130 is a dummy silicon wafer, which can be grounded or surface-treated to have a smaller thickness variation in different positions. As shown in FIG. 2B, the plurality of chips 110 are disposed on the supporting board 130 by using die attach films 120, each of the die attach films 120 having different thickness to compensate for difference in thickness of different parts of the supporting board 130. Additionally, in the present embodiment, the variation in the thickness of the DAF 120 in different positions may be less than 1 micrometer. Therefore, a flat platform may be provided for the chip 110 since the supporting board 130 and the DAF 120 have minimal or low thickness variation. It should be mentioned that, in other embodiments, the DAF 120 may be disposed onto the supporting board 130 first before disposing the chip 110 to the supporting board 130. Then, the back surface 114 of the chip 110 is disposed onto the DAF 120. In this way, the chip 110 is connected to the supporting board 130.

Figure 2C:
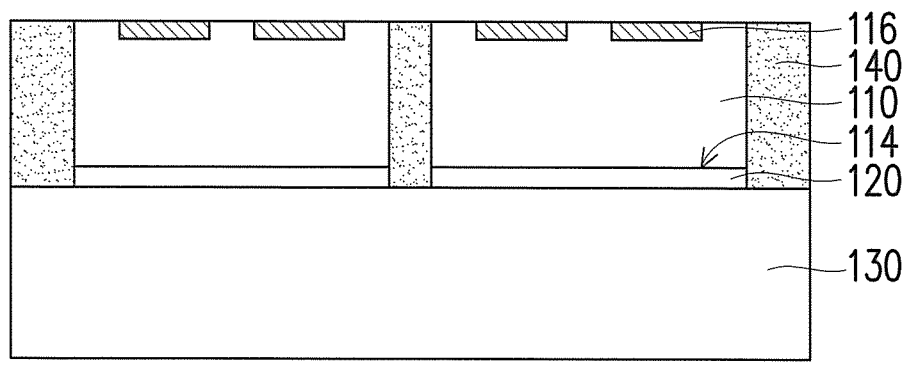

Then, as shown in FIG. 2C, a molding 140 is disposed on the supporting board 130 through performing a wafer level exposed die molding procedure on the chip 110. The molding 140 may surround the chip 110. And, the pads 116 of the chip 110 are exposed through the molding 140 (Step 240). In the present embodiment, a surface of the molding 140 disposed at a distance from the supporting board 130 is substantially flush with the active surface 112 of the chip 110. In some other embodiments, the surface of the molding 140 disposed at a distance from the supporting board 130 may have a height less than the height of the pads 116 of the chip 110 corresponding to the supporting board 130. As shown in FIG. 2C, the molding 140 is disposed on the supporting board 130 to surround lateral sides of the plurality of chips 110 by performing a wafer level exposed die molding procedure on the plurality of chips 120, the active surfaces 112 of the plurality of chips 120 being substantially flush with a surface of the molding 140.

Since the supporting board 130 and the DAF 120 provide a flat platform for the chip 110, after the chip 110 is disposed on the supporting board 130, the height variation of pads 116 of different chips 110 is small to none. Thus, the height of the molding 140 may be precisely controlled when forming the molding 140. Therefore, the pads 116 may be exposed through the molding 140. That is, after the chip 110 is disposed on the supporting board 130, since the height variation of different pads 116 is small, the conventional steps to compensate for the height difference is no longer needed. The conventional steps may consist of additionally manufacturing the conductive pillars on the pads 116 of the chip 110 to gain height, disposing the molding whose height is higher than the height of the chip 110 and the conductive pillars, and grinding the molding and the conductive pillars.

Figure 2D:
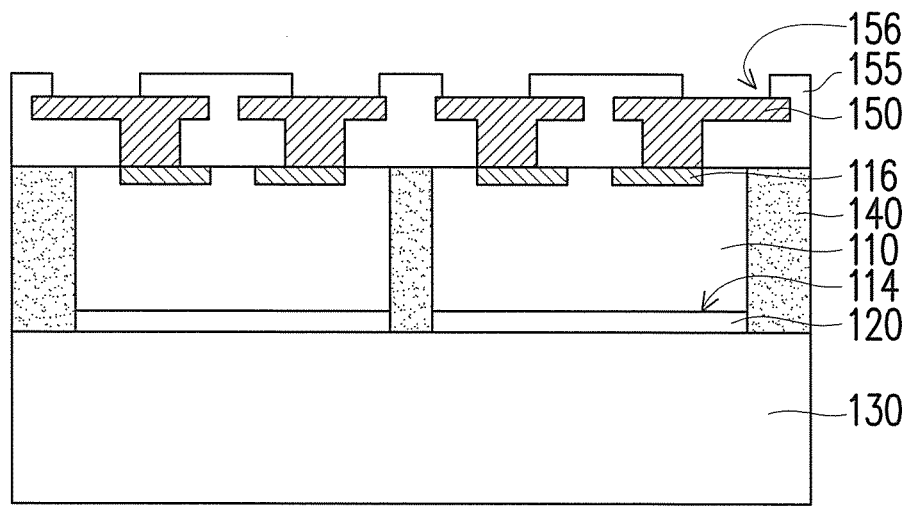

Then, as shown in FIG. 2D, a redistribution layer (RDL) 150 is formed on the active surface 112 of the chip 110. The RDL 150 may be electrically connected to the pads 116 (Step 250). After, a dielectric layer 155 having openings 156 is formed on the RDL 150. More specifically, the redistribution layer (RDL) 150 is formed on the active surfaces 112 of the plurality of chips 110 and the surface of the molding 140.

Figure 2E:
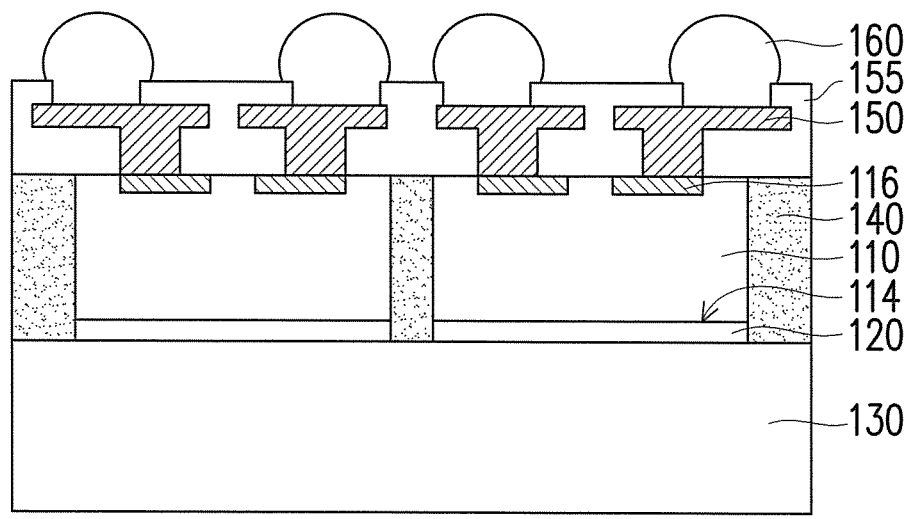

Then, as shown in FIG. 2E, a plurality of solder balls 160 are disposed onto the RDL 150 (Step 260). The solder balls 160 are disposed in the openings 156 of the dielectric layer 155 on the RDL 150 so as to be electrically connected to the RDL 150. Thus, the solder balls 160 may be electrically connected to the chips 110.

Figure 2F:
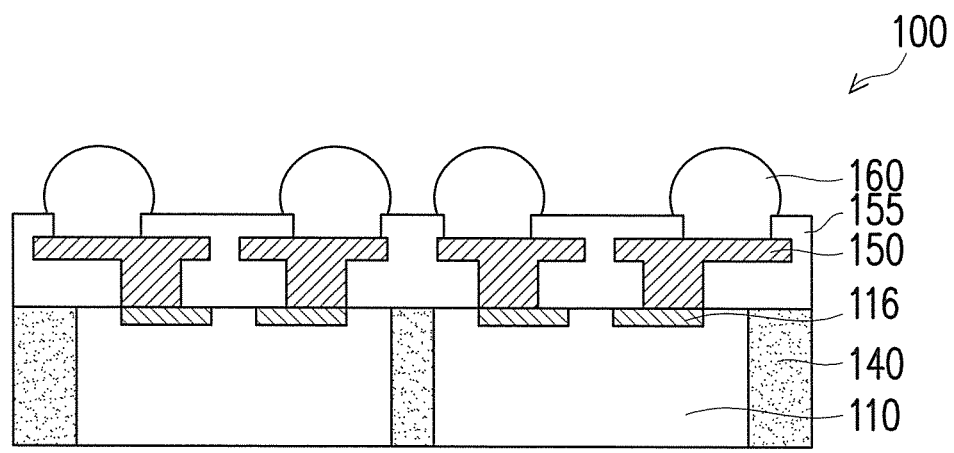

Lastly, as shown in FIG. 2F, the supporting board 130 and the DAF 120 are removed from the chip 110 (Step 270) to form the wafer level package structure 100 of the embodiment. In the present embodiment, the supporting board 130 and the DAF 120 are removed from the chip 110 by cutting or grinding. By using the method of cutting or grinding, the wafer level package structure 100 may be reduced to the desired thickness depending on the requirement. Thus, a thickness of the plurality of chips 110 may be reduced to a preferred thickness, so that a wafer level package structure 100 with thinner thickness may be provided. The wafer level package structure 100 may have a lower cost and simpler processing in comparison with using the method of chemical cleaning In summary, in the manufacturing method of the wafer level package structure of the invention, by using the supporting board comprised of the dummy silicon wafer, and fixing the chip to the supporting board through the DAF, the thickness variation of the supporting board composed of the dummy silicon wafer and the DAF in different positions is small. Thereby, the flat platform is provided for supporting the chip. Also, after the chip is disposed on the supporting board, the height variation of the pads is small. Thus, when manufacturing the molding, the wafer level exposed die molding procedure can be used, so that the pads are exposed out of the molding. That is, it is not required to additionally dispose the conductive pillars on the chip. Also, it is not required to grind the molding after manufacturing the molding so as to save multiple processes. Additionally, in the step of removing the supporting board and the DAF from the chip of the manufacturing method of the wafer level package structure of the invention, removing the supporting board and the DAF only by using the method of grinding is more simple and with lower cost in comparison of using the method of chemical cleaning. Also, it can make sure the cleanliness of the supporting board and the cleanliness of the back surface of the chip.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A manufacturing method of a wafer level package structure, comprising:
    disposing a plurality of chips on a supporting board by adhering the plurality of chips on the supporting board using die attach films, the plurality of chips having corresponding active surfaces substantially leveled to each other, and each of the die attach films having different thickness to compensate for difference in thickness of different parts of the supporting board;
    disposing a molding on the supporting board to surround lateral sides of the plurality of chips, the active surfaces of the plurality of chips being substantially flush with a surface of the molding;
    forming a redistribution layer (RDL) on the active surfaces of the plurality of chips and the surface of the molding; and
    removing the plurality of chips from the supporting board.

2. The method of claim 1, wherein a thickness variation of the die attach films from each other is less than 1 micrometer.

3. The method of claim 1, further comprising:
    disposing a plurality of solder balls on the redistribution layer to electrically connect the plurality of chips to the solder balls.

4. The method of claim 1, wherein disposing a molding on the supporting board to surround lateral sides of the plurality of chips is performing a wafer level exposed die molding procedure on the plurality of chips.

5. The method of claim 1, wherein removing the plurality of chips from the supporting board is performing cutting or grinding to remove the plurality of chips from the supporting and reduce thickness of the plurality of chips to a preferred thickness.

6. The method of claim 1, wherein the supporting board is a dummy silicon wafer.

* * * * *